United States Patent
Gregor et al.

(10) Patent No.: US 6,300,809 B1
(45) Date of Patent: Oct. 9, 2001

(54) DOUBLE-EDGE-TRIGGERED FLIP-FLOP PROVIDING TWO DATA TRANSITIONS PER CLOCK CYCLE

(75) Inventors: Roger Paul Gregor, Endicott, NY (US); David James Hathaway, Underhill Center, VT (US); David E. Lackey, Jericho, VT (US); Steven Frederick Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/616,551

(22) Filed: Jul. 14, 2000

(51) Int. Cl.$^7$ .......................... H03K 3/12; H03K 3/037; H03K 3/286; H03K 3/356
(52) U.S. Cl. .................. 327/200; 327/407; 327/298; 327/299; 327/202
(58) Field of Search .................. 327/199–203, 327/208–210, 211, 212, 214, 215, 218, 407–408, 298, 299; 326/93–98

(56) References Cited

U.S. PATENT DOCUMENTS

| | | | |
|---|---|---|---|
| 3,553,497 | 1/1971 | Smith | 327/202 |
| 3,783,254 | * 1/1974 | Eichelberger | 327/217 |
| 4,495,629 | 1/1985 | Zasio et al. | 327/202 |
| 4,629,909 | 12/1986 | Cameron | 327/211 |
| 4,873,456 | * 10/1989 | Olisar et al. | 327/202 |
| 5,130,568 | 7/1992 | Miller et al. | 327/202 |
| 5,148,052 | * 9/1992 | Yellamilli | 327/212 |
| 5,179,295 | 1/1993 | Mattison et al. | 327/199 |

(List continued on next page.)

FOREIGN PATENT DOCUMENTS

| | | |
|---|---|---|
| 06-152336 | 5/1994 | (JP) . |
| 11-112296 | 4/1999 | (JP) . |
| WO 99/26341 | 5/1999 | (WO) . |

OTHER PUBLICATIONS

Lu, et al., (1990), "A Novel CMOS Implementation of Double–Edge–Triggered Flip–Flops", IEEE Journal of Solid–State Circuits, vol. 25, No. 4, pp. 1008–1010.

Lu, (1998), "A Safe Single–Phase Clocking Scheme for CMOS Circuits", IEEE Journal of Solid–State Circuits, vol. 23, No. 1, pp. 280–283.

Unger,(1981), "Double–Edge–Triggered Flip–Flops", IEEE Transactions on Computers, vol. C–30, No. 6, pp. 447–451.

Weste, et al.,(1993), "Principles of CMOS VLSI Design A Systems Perspective", Addison–Wesley Publishing Company, pp. 328–329.

Afghahi, et al.,(1991), "Double Edge–Triggered D–Flip–Flops for High–Speed CMOS Circuits", IEEE Journal of Solid–State Circuits, vol. 26, No. 8, pp. 1168–1170.

*Primary Examiner*—Terry D. Cunningham
*Assistant Examiner*—Long Nguyen
(74) *Attorney, Agent, or Firm*—Scully, Scott, Murphy & Presser; Richard A. Henkler

(57) ABSTRACT

An apparatus comprising a clock for providing a clock signal, means for providing a delayed version of the clock signal, two transparent latches having clock inputs controlled by opposite polarities of the delayed clock signal, a multiplexer having (i) inputs fed by outputs of the latches, and (ii) a select input fed by the clock signal, and means for providing a select signal for selecting the latch whose clock is inactive. Preferably, each of the latches has a scan input gate and a scan output gate, and the scan output of the first latch is applied to the scan input of the second latch to form a scannable latch pair. Also, preferably, the apparatus further comprises a data port for applying data to the first and second latches, and an exclusive OR gate at the data port, whereby the apparatus produces a gated clock signal. Also disclosed is a method of operating this apparatus.

6 Claims, 8 Drawing Sheets

U.S. PATENT DOCUMENTS

| | | | |
|---|---|---|---|
| 5,250,852 | * 10/1993 | Ovens et al. | 327/202 |
| 5,327,019 | 7/1994 | Kluck | 327/202 |
| 5,406,216 | * 4/1995 | Millman et al. | 327/202 |
| 5,500,861 | * 3/1996 | Oppedahl | 714/731 |
| 5,646,567 | 7/1997 | Felix | 327/202 |
| 5,774,003 | 6/1998 | Qureshi et al. | 327/202 |
| 5,793,236 | 8/1998 | Kosco | 327/218 |
| 5,844,844 | 12/1998 | Bauer et al. | 365/189.05 |
| 5,867,036 | 2/1999 | Rajsuman | 326/16 |
| 5,880,613 | 3/1999 | Ishihara | 327/202 |
| 6,031,410 | * 2/2000 | Kanno | 327/407 |
| 6,137,331 | * 10/2000 | Peset Llopis | 327/199 |

* cited by examiner

OVERALL VIEW OF DETF

INTERNAL VIEW OF DATF

SCAN/TESTCLOCK VIEW
OF DETF'S (CLOCK AND D NOT SHOWN)

DETF CLOCK-GATING CAPABILITY

PREFERED EMBODIMENT TIMING
-DATA TRANSITIONS OCCUR ON EVERY EDGE

ALTERNATIVE EMBODIMENT TIMING
-CYCLE STEALING CAPABILITY (CLOCK OVERLAP)

CLOCK

DATA IN (BEFORE EDGE):

RESULTING DATA OUT (Q):

DATA IN (AFTER EDGE, WITHIN DELAY MARGIN D):

RESULTING DATA OUT (Q)

(Q TRANSITIONS AFTER DESIRED EDGE, DELAY MARGIN IS "BORROWED"
FROM DOWNSTREAM PATH AFTER DESIRED EDGE)

CLOCK GATING ALTERNATIVE EMBODIMENT

ALTERNATIVE EMBODIMENT-MUX-SCAN DETF

LSSD-BASED APPROACH
(PREFERED AS
MUX-SCAN ALTERNATIVE)

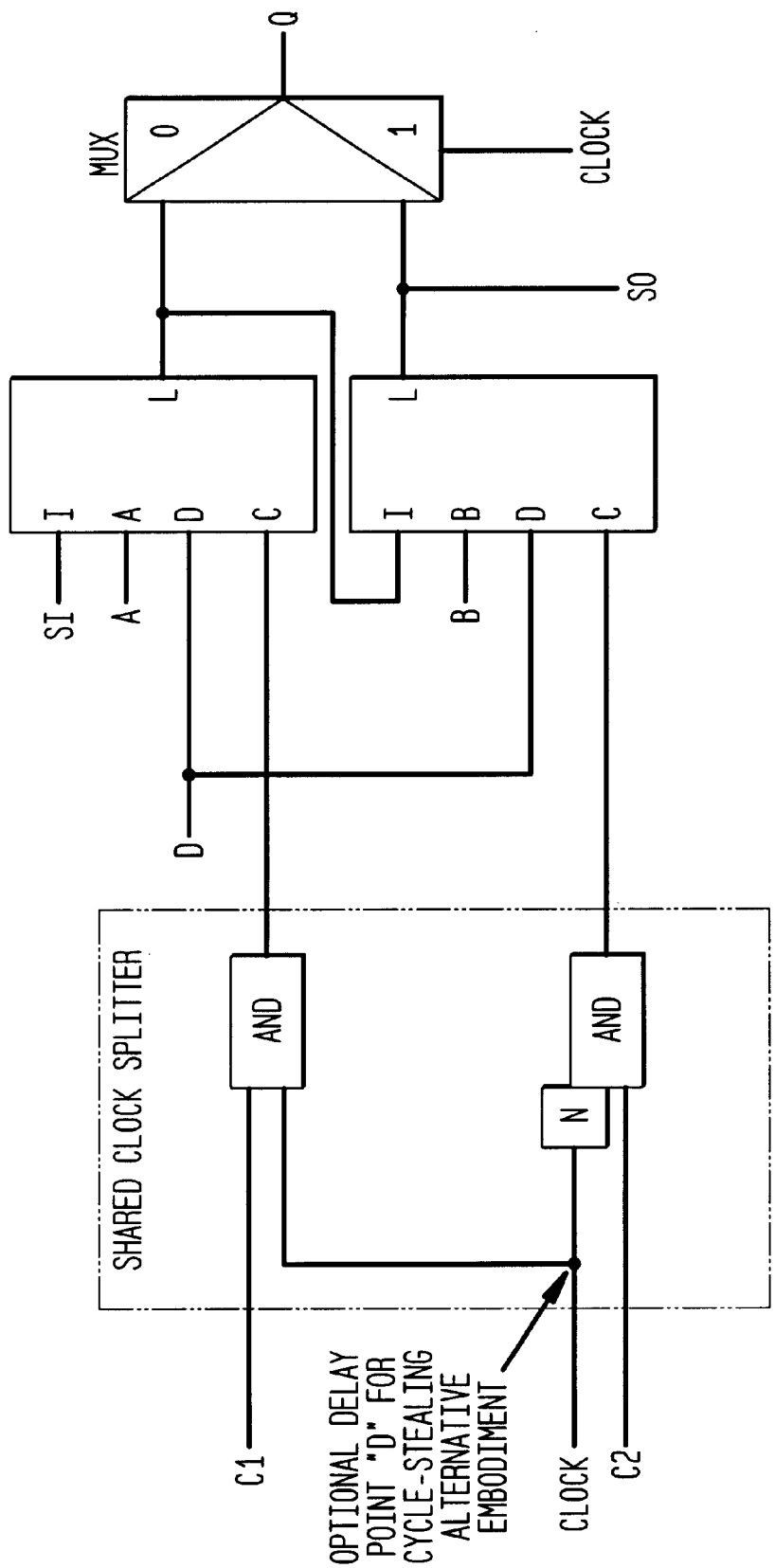
FIG. 10  ALTERNATIVE EMBODIMENTS: SHARED CLOCK SPLITTERS

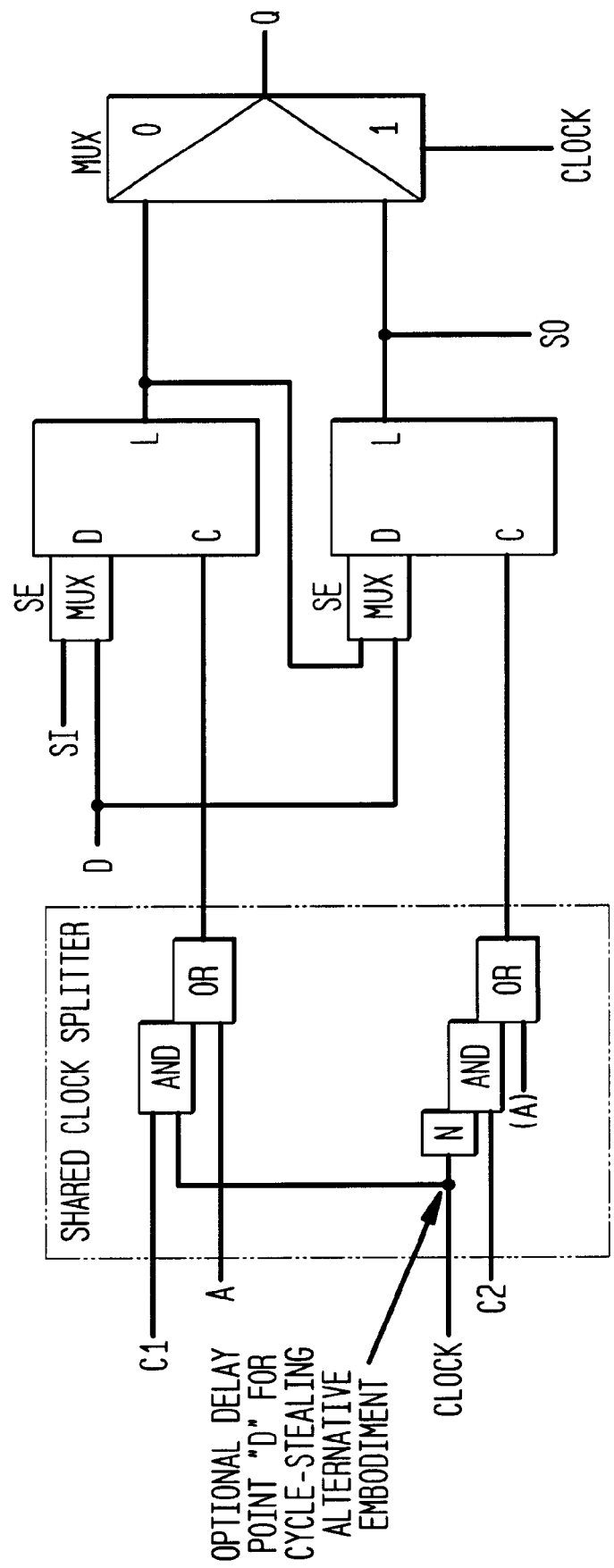
FIG. 11 ALTERNATIVE EMBODIMENT: SHARED CLOCK SPLITTERS

DOUBLE-EDGE-TRIGGERED FLIP-FLOP PROVIDING TWO DATA TRANSITIONS PER CLOCK CYCLE

BACKGROUND OF THE INVENTION

This invention generally relates to double-edge triggered flip flops, and more specifically, the invention relates to scannable, double-edge triggered flip-flops.

A flip-flop is an electronic circuit that stores a selected logical state in response to a clock pulse and one or more data input signals. Flip-flops are used in to computational circuits. In these circuits, the flip-flops operate in selected sequences during recurring clock intervals to capture and hold certain data for a period of time sufficient for the other circuits within the system to further process that data. At each clock signal, data are stored in a set of flip-flops whose outputs are available to be applied as inputs to other combinatorial or sequential circuitry during successive clock signals. In this manner, sequential logic circuits are operated to capture, store and transfer data during the successive clock signals.

Most flip-flops are designed to store the logical state represented by an input signal present when a leading edge of a clock pulse is received. Other flip-flops store the logical state indicated by an input signal on receipt of the trailing edge of a clock pulse. Still other flip-flops store data on both the leading edge and the trailing edge of a clock pulse. These latter flip-flops are referred to as double-edge triggered flip flops, or DETFs.

Double edge triggered flip-flops are commonly used in circuits where it is desirable to have a fast clock as well as the normal system clock. As it is also desirable to minimize clock distribution to save layout space, double edge triggered flip-flops offer an option of providing components operating at more than one speed of operation but which require only a single clock. Such techniques also have advantages in saving power, since it is only necessary to generate one source clock signal for two speeds of operation. In particular, since power consumption of the clock distribution network is proportional to the frequency of the clock, achieving a certain speed of operation using a half-speed clock source will reduce by half the power consumption of the clock network, when compared to single edge flip-flop operation.

It is often desirable or necessary to test the functionality of flip-flops, and scan testing is one well known way to do this. In scan testing, known signals are applied to a specific input of the flip flop, and the output of the flip-flop is checked to determine if that output is what the input signals were expected to produce. The input of the flip-flop to which these test signals are applied is referred to as the scan input, and commonly flip-flops have one input that is dedicated primarily or exclusively for this purpose.

Known double-edge flip-flop designs are not scannable. A loss of scan-based test capability is a severe detriment to product quality and/or time-to-market. A loss of clock-gating capability eliminates a means of reducing clock network power based upon transition, or state change, requirements at the flip-flops. The loss of clock-gating capability also eliminates the DETFs power reduction benefits, or even increases power, for those designs whose flip-flops do not require transitions at each clock edge.

SUMMARY OF THE INVENTION

An object of this invention is to improve double-edge triggered flip flops.

Another object of the present invention is to provide a sequential design of flip-flops that allows for a reduction in power over the sequential design comprised of flip-flops whose data outputs transition once per clock cycle.

A further object of this invention is to provide a double-edge triggered flip flop where testability is not lost due to the use of both edges.

Still another object of the present invention is to provide a double-edge triggered flip flop where the ability to perform clock gating is not lost due to the use of both edges.

These and other objectives are attained with an apparatus comprising a clock for providing a clock signal, means for providing a delayed version of the clock signal, two transparent latches having clock inputs controlled by opposite polarities of the delayed clock signal, a multiplexer having (i) inputs fed by outputs Of the latches, and (ii) a select input fed by the clock signal, and means for providing a select signal for selecting the latch whose clock is inactive.

Preferably, each of the latches has a scan input gate and a scan output gate, and the scan output of the first latch is applied to the scan input of the second latch to form a scannable latch pair. Also, preferably, the apparatus further comprises a data port for applying data to the first and second latches, and an exclusive OR gate at the data port, whereby the apparatus produces a gated clock signal.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIGS. 10 and 11 illustrate a feature referred to as a shared clock splitters.

DETAILED DESCRIPTION OF THE PREFERRED EMBODIMENTS

Figure 1:
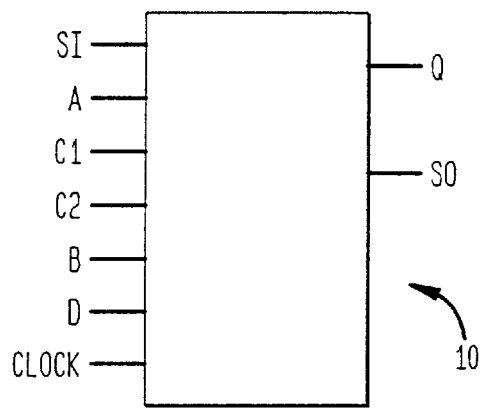
FIG. 1 is an overall view of a double-edge triggered flip-flop.
Figure 2:
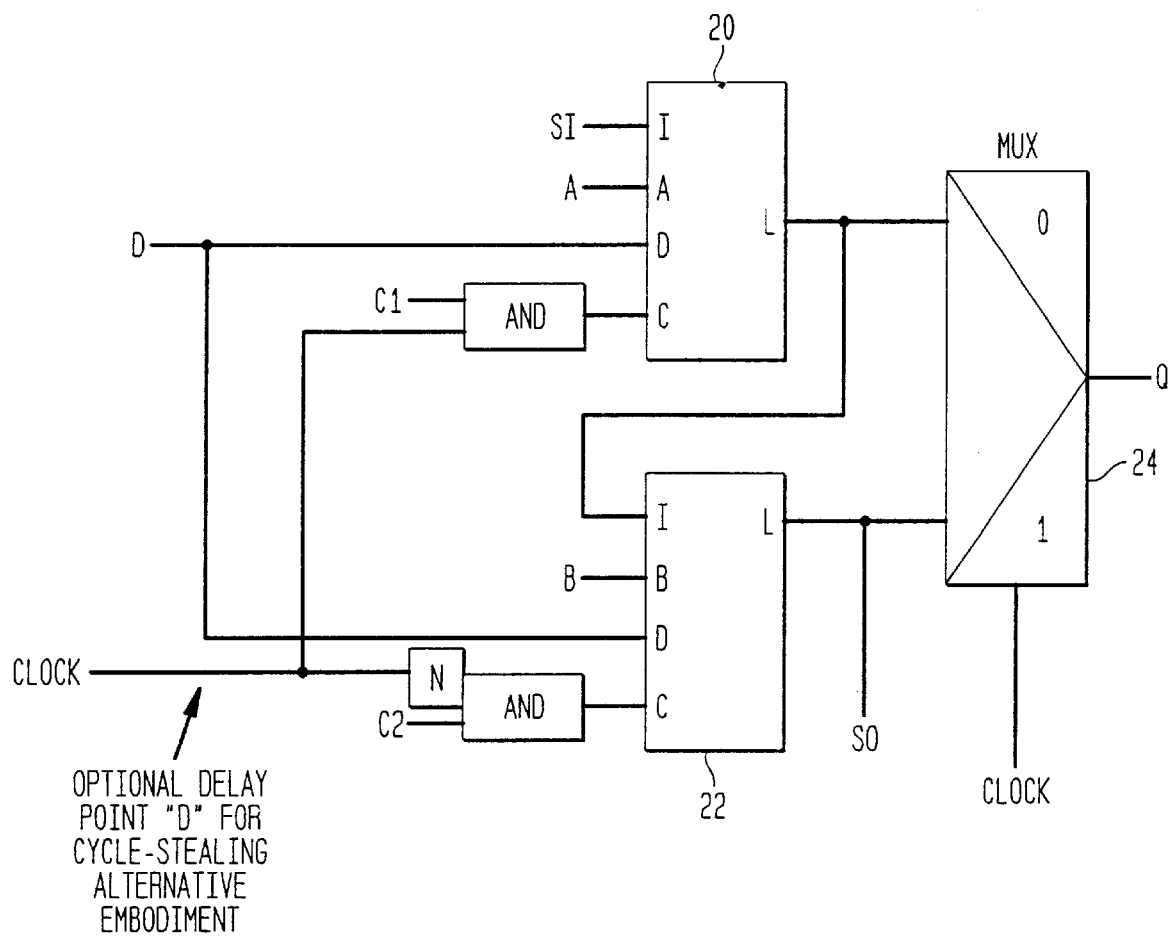
FIG. 2 is an internal view of the double-edge triggered flip-flop.
Figure 5:
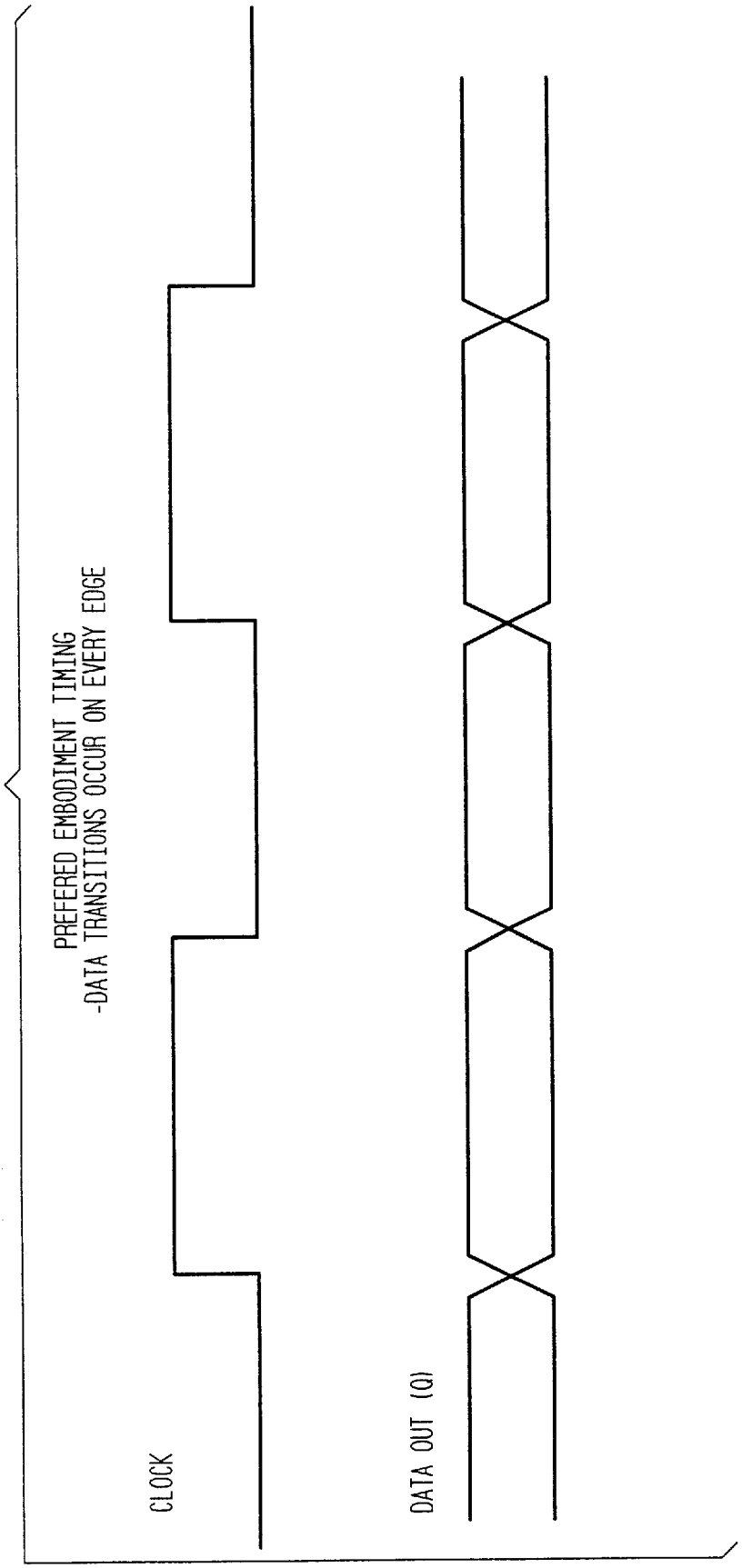
FIG. 5 shows the clock and data output timing of a double-edge triggered flip-flop.

FIG. 1 shows a double edge triggered flip-flop 10 including seven inputs and two outputs. Specifically, the inputs are a scan input SI, inputs A, C1, C2, B and D, and a clock input. The two outputs include data output Q and scan output SO. FIG. 2 illustrates the internal elements of the DETF 10; and as shown in FIG. 2, DETF 10 includes individual latches 20 and 22, multiplexer 24, and AND gate and a NOT AND gate. As generally illustrated in FIG. 5, the flip-flop 10 has a data output transition at each edge of the clock input.

Flip-flop 10 thus includes two level sensitive latches, each having a system port and a scan (port=data+clock).

Figure 3:
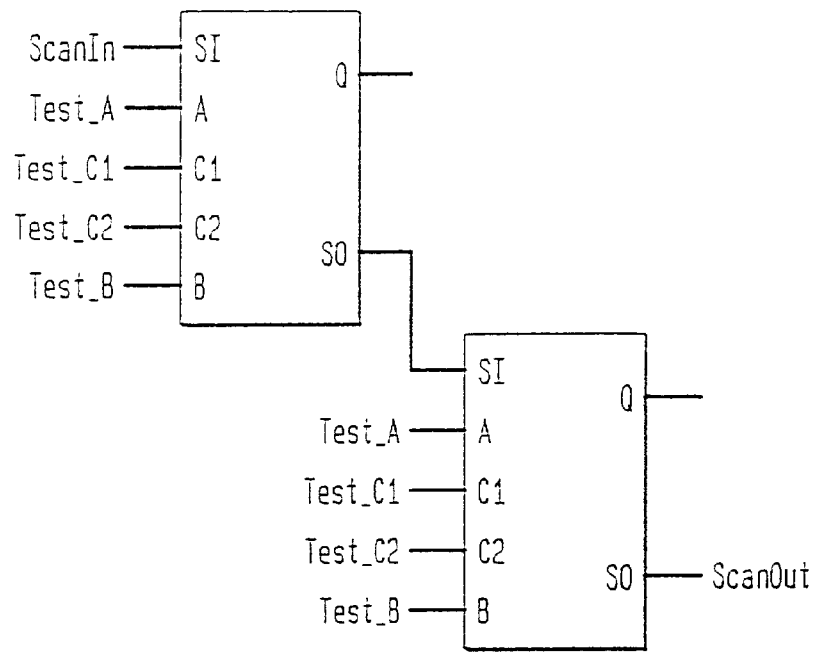
FIG. 3 is a scan/test view of the double-edge flip-flop.

The output of the first latch is connected to the scan data input of the second latch, resulting in a scannable latch-pair (i.e. scannable flip-flop). Scan is achieved by alternate A and B clocking, SI transitions after B becomes high and before A becomes high. With reference to FIG. 3, testing of either latch's data port is achieved by pulsing C1 or C2 (while the other of C1 and C2 and ports A and B are held low), allowing the latch to capture the input data. The clock input must be one for C1 to capture, and zero for C2 to capture, said value is set by the test software, either by scanning the DETF or other scannable flop that produces clock, or the component PI that produces clock. The SO of one double-edge latch is connected to the SI of another latch, creating a scan chain.

Double-edge system operation performed (C1=C2=1 and A=B=O during system operation), by clocking the data port of the first latch when clock=1 and by clocking the second latch when clock=0. The MUX selects the stable output of the first latch when clock=0 and the output of the second latch when clock=1.

Figure 4:
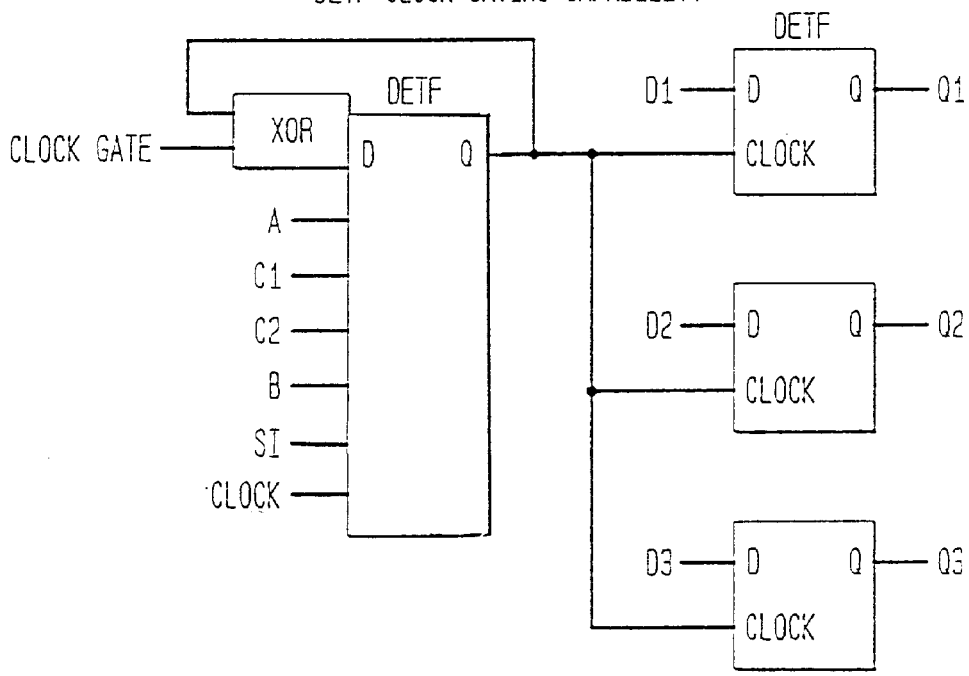
FIG. 4 illustrates the clock gating capability of a double-edge flip-flop embodying the present invention.

As shown in FIG. 4, DETF is fed at its data input by an XOR of a gate signal and the output of said DETF. This DETF output thus produces a gated clock that can be said to block capture in system operation for other DETF's receiving this gated clock at their clock inputs.

Figure 6:
FIG. 6 shows an alternate clock/data output timing.
Figure 6:
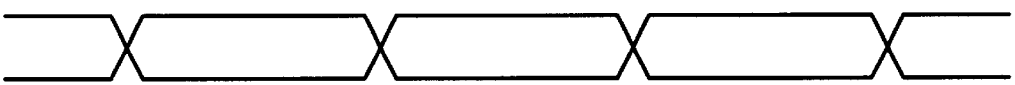
Figure 6:
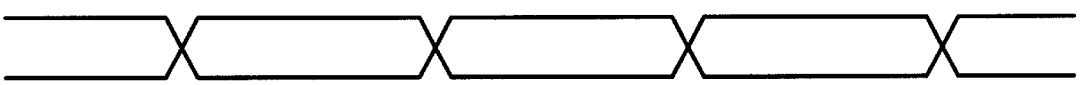
Figure 6:
Figure 6:

By adding a delay at point D (see FIG. 2), the capture of data in either of the DETF's two latches can be delayed, whereas the clock signal to the output MUX is not delayed. The benefit of this arrangement is that it provides cycle stealing. This means that, during the period of delayed capture, see FIG. 6, the latch that is being written is held transparent for a period (equal to the delay) after the output MUX selects the latch's output value. When the data is available at the latch to be written at or before the selection of said latch at the output MUX due to transition of clock, then the normal system cycle (as without cycle stealing) is prevalant, and the logic fed by this DETF sees the DETF's output data at the beginning of the cycle.

However, if the data is late (i.e. after the transition of clock), but still within the period of delay, it will still be captured in the latch intended to be written; however the data is not available to logic fed by the DETF until the late time. Therefore the path to the DETF has "stolen time" (e.g. cycle stealing) from the path starting at the DETF's output through the logic fed by the DETF. The advantage of this enhancement is to allow a design method for increased system performance.

This cycle-stealing enhancement can be used together with the scan capability and the clock gating capability in either the preferred embodiment, or any of the alternative embodiments.

Figure 7:
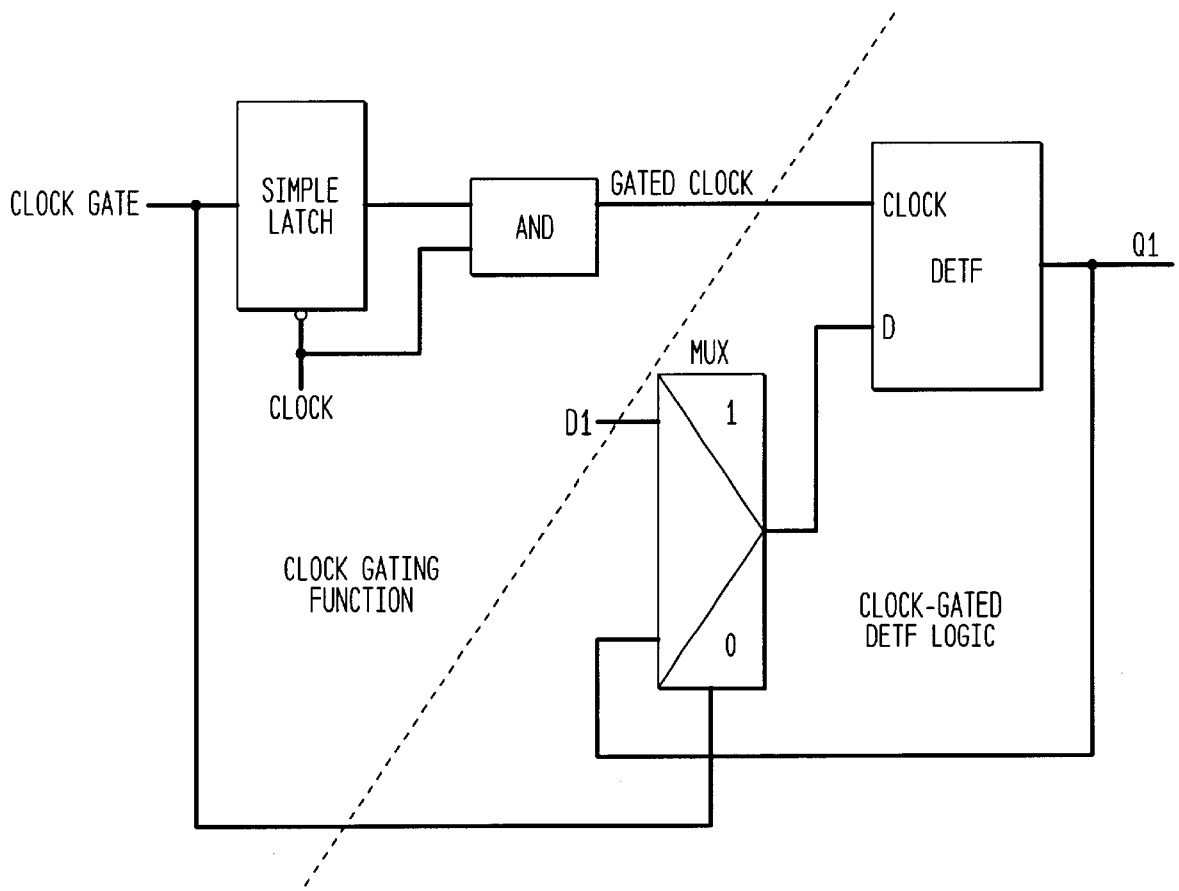
FIG. 7 schematically illustrates an alternate embodiment of the present invention.

With reference to FIG. 7, the gated clock is produced by feeding the gate signal to a simple latch (SL) clocked by the inverse of the clock that causes the gate signal to transition. The output of the latch is ANDed with the noninverted clock, and the result is a gated version of the noninverted clock, where the original gate signal transitioned on the same edge as the result gated clock, but on the prior cycle. Additionally, the data inputs to all DETF's that use the gated clock must be fed by a mux selected by the original gate, whereby the intended data for each said DETF is selected when the gate is high, and the output of the said DETF is selected when the gate is low.

This method may have advantages given the parameters of the target technology (relative chip area for logic types), but it appears for most cases that the preferred embodiment would be the better choice, especially when wirability is considered.

Figure 8:
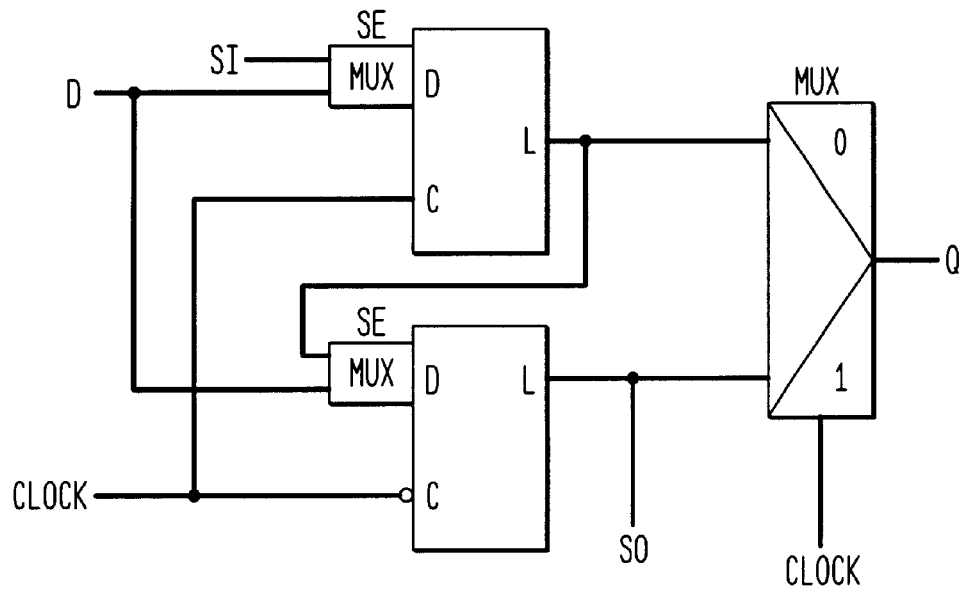
FIGS. 8 and 9 show two additional alternate embodiments, referred to as Mux-scan DETFs.

In some designs, it may be desirable for scan operation to be performed using the system clock (where scan data, like system data, transitions on both clock edges). One method is shown in FIG. 8, where each of the two latches comprising the DETF has a mux that selects the scan path instead of the system path, under control of a scan-enable signal used as the mux-select. This method has the disadvantage that manufacturing, or component, testing of the chip must also use scan based upon the system clock, whereby correct timing operation of the scan path must be ensured, all clock gate signals must be forced into the enabling state, and all system clock paths must have controlling path from an input, which often causes significant intrusion on the mission critical system clock signal.

Figure 9:
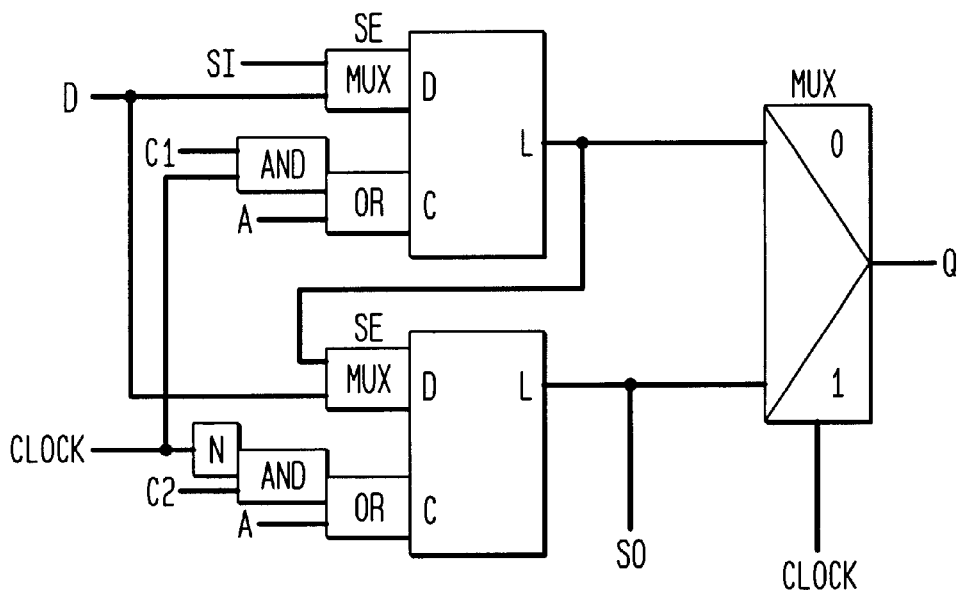

A preferred approach is shown in FIG. 9, This design uses LSSD clocking in addition to system clocking (the LSSD clocks A, B, C1, C2), which alleviates all the above disadvantages since this LSSD method controls the scan operation independent of the system clock operation. Mux-scan using system clock can still be employed for in-system use by activating the scan-enable while the system clock is active.

With reference to FIGS. 10 and 11, the gating logic used for controlling the direct clock inputs to the latches within the DETF can optionally be implemented in a logic cell separate from the DETF, called a clock splitter, and the clock splitter can then be shared across a number of DETF's that are controlled by the same system clock. The diagrams show the clock splitters for both the preferred embodiment and the alternative LSSD-based mux-scan method.

The use of the clock splitter provides an advantage of chip area reduction (sharing the input clock logic across multiple latches) and chip wiring (fewer signals are connected to the DETF's, whereas the full set of signals that are connected to the smaller number of clock splitters are in turn fewer in number).

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An apparatus comprising:
    a clock for providing a clock signal;
    means for providing a delayed version of the clock signal;
    two transparent latches having clock inputs controlled by opposite polarities of the delayed clock signal;
    a multiplexer having (i) inputs fed by outputs of the latches, and (ii) a select input fed by the clock signal; and
    means for providing a select signal for selecting the latch whose clock is inactive.

2. Apparatus according to claim 1, wherein:
    each of the latches has a scan input gate and a scan output gate; and
    the scan output of the first latch is applied to the scan input of the second latch to form a scannable latch pair.

3. Apparatus according to claim 2, further comprising:
    a data port for applying data to the first and second latches; and
    an exclusive OR gate at the data port, whereby the apparatus produces a gated clock signal.

4. A method of operating a double edge triggered flip flop including two transparent latches having clock inputs and a multiplexer, the method comprising the steps of:

providing a clock signal;

providing a delayed version of the clock signal;

controlling the clock inputs of the latches by opposite polarities of the delayed clock signal;

feeding outputs of one of the latches to an input of the other of the latches, and feeding the clock signal to a select input of the multiplexer; and providing a select signal for selecting the latch whose clock is inactive.

5. A method according to claim 4, wherein each of the latches has a scan input and a scan output, and further comprising the step of applying the scan output of a first of the latches to the scan input of a second of the latches to form a scannable latch pair.

6. A method according to claim 4, further comprising the steps of:

applying data to a data port of the two latches; and providing an exclusive OR gate at the data port, whereby the apparatus produces a gated clock signal.

* * * * *

UNITED STATES PATENT AND TRADEMARK OFFICE
CERTIFICATE OF CORRECTION

PATENT NO. : 6,300,809 B1  
DATED : October 9, 2001  
INVENTOR(S) : R. Gregor et al.

It is certified that error appears in the above-identified patent and that said Letters Patent is hereby corrected as shown below:

<u>Column 1,</u>
Line 55, "...are not scannable." should read -- ...are not scannable and do not allow clock gating capability. --

<u>Column 2,</u>
Line 17, "Of" should read -- of --

<u>Column 3,</u>
Line 13, "clock=1" should read -- clock=0 --
Line 14, "clock=0" should read -- clock=1 --

Signed and Sealed this

Fifteenth Day of October, 2002

Attest:

Attesting Officer

JAMES E. ROGAN
Director of the United States Patent and Trademark Office